United States Patent
Penticoff et al.

(10) Patent No.: US 10,749,487 B2
(45) Date of Patent: Aug. 18, 2020

(54) UNPOWERED SWITCHING MODULE

(71) Applicant: SKYWORKS SOLUTIONS, INC., Woburn, MA (US)

(72) Inventors: Joel Anthony Penticoff, Cedar Rapids, IA (US); Pradeep A. Balaraman, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 655 days.

(21) Appl. No.: 15/044,071

(22) Filed: Feb. 15, 2016

(65) Prior Publication Data

US 2016/0241300 A1  Aug. 18, 2016

Related U.S. Application Data

(60) Provisional application No. 62/116,498, filed on Feb. 15, 2015.

(51) Int. Cl.
*H03F 3/24* (2006.01)
*H03F 3/195* (2006.01)
*H03K 17/693* (2006.01)

(52) U.S. Cl.
CPC ............ *H03F 3/245* (2013.01); *H03F 3/195* (2013.01); *H03F 2200/451* (2013.01); *H03K 17/693* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,574,981 A | * | 11/1996 | Ahonen | G01R 29/10 455/67.14 |
| 6,281,762 B1 | * | 8/2001 | Nakao | H03K 17/687 327/308 |
| 6,329,880 B2 | | 12/2001 | Akiya | |
| 6,442,371 B1 | * | 8/2002 | Lyu | G01R 23/17 324/637 |
| 6,738,601 B1 | * | 5/2004 | Rofougaran | H03B 21/01 327/427 |
| 2002/0000866 A1 | | 1/2002 | Weiss et al. | |
| 2003/0090313 A1 | * | 5/2003 | Burgener | H01P 1/15 327/408 |
| 2004/0077150 A1 | * | 4/2004 | Tosaka | H03K 17/693 438/313 |
| 2004/0166804 A1 | * | 8/2004 | Moloudi | H03H 11/1291 455/20 |
| 2004/0229577 A1 | * | 11/2004 | Struble | H03K 17/063 455/127.1 |

(Continued)

FOREIGN PATENT DOCUMENTS

| CN | 1331865 | 1/2002 |
|---|---|---|
| CN | 103026625 | 4/2013 |

(Continued)

*Primary Examiner* — Zhiyu Lu
(74) *Attorney, Agent, or Firm* — Chang & Hale LLP

(57) ABSTRACT

Unpowered switching module. A switching module can include a first input terminal, a second input terminal, and an output terminal. The output terminal can be configured to output a radio-frequency (RF) component of an input signal received on the first input terminal or the second input terminal in response to the input signal including a positive direct-current (DC) voltage.

11 Claims, 9 Drawing Sheets

(56) References Cited

U.S. PATENT DOCUMENTS

| | | | | |
|---|---|---|---|---|
| 2004/0235549 | A1* | 11/2004 | Struble | H01P 1/15 463/16 |
| 2005/0093026 | A1* | 5/2005 | Sagae | H01P 1/15 257/213 |
| 2006/0194558 | A1* | 8/2006 | Kelly | H03K 17/6871 455/319 |
| 2006/0281418 | A1* | 12/2006 | Huang | H04B 1/48 455/78 |
| 2007/0024369 | A1* | 2/2007 | Cao | H03F 3/195 330/269 |
| 2007/0069798 | A1 | 3/2007 | Kusachi | |
| 2007/0290744 | A1* | 12/2007 | Adachi | H03F 3/24 330/51 |
| 2009/0002259 | A1* | 1/2009 | Breiter | H01P 1/15 343/876 |
| 2010/0013571 | A1* | 1/2010 | Arell | H03K 17/165 333/103 |
| 2011/0050515 | A1* | 3/2011 | Liu | H01Q 21/24 343/703 |
| 2014/0009214 | A1* | 1/2014 | Altunkilic | H03K 17/161 327/427 |
| 2015/0236739 | A1* | 8/2015 | Montalvo | H03M 1/121 455/307 |

FOREIGN PATENT DOCUMENTS

| | | |
|---|---|---|
| JP | 64-003226 | 1/1989 |
| JP | 08-204622 | 8/1996 |
| JP | 2001-237721 | 8/2001 |
| JP | 2002-533980 | 10/2002 |
| JP | 2006-191277 | 7/2006 |
| JP | 3860191 | 12/2006 |
| KR | 10-1998-0073486 | 11/1998 |
| KR | 10-2011-0071933 | 6/2011 |
| KR | 10-2014-0032533 | 3/2014 |

* cited by examiner

UNPOWERED SWITCHING MODULE

CROSS-REFERENCE TO RELATED APPLICATION(S)

This application claims priority to U.S. Provisional Application No. 62/116,498 filed Feb. 15, 2015, entitled UNPOWERED SINGLE-POLE MULTI-THROW SWITCH, the disclosure of which is hereby expressly incorporated by reference herein in its entirety.

BACKGROUND

Field

The present disclosure generally relates to switches, and in particular, relates to single-pole multi-throw (SPMT) switches.

Description of the Related Art

Portable wireless devices may include one or more chipsets that are partitioned into separate physical modules, each connected to a serial control bus. Controlling a multiplexing RF switch between such modules may include powering up a separate module that contains the switch. It may also include a separate control command to be written to the module to select the desired switch position. In some embodiments, discrete switch control lines may be present between modules to effectuate multiplexing. However, the addition of such lines into a chipset may increase size and cost of the chipset.

SUMMARY

In accordance with some implementations, the present disclosure relates to a switching module. The switching module includes a first input terminal, a second input terminal, and an output terminal. The output terminal is configured to output a radio-frequency (RF) component of an input signal received on the first input terminal or the second input terminal in response to the input signal including a positive direct-current (DC) voltage.

In some embodiments, the switching module can include a first transistor having a drain coupled to the first input terminal via a first capacitor, a gate coupled to the first input terminal via a first resistor, and a source coupled to the output terminal. In some embodiments, the switching module can further include a second transistor having a drain coupled to the second input terminal via a second capacitor, a gate coupled to the second input terminal via a second resistor, and a source coupled to the output terminal.

In some embodiment, the switching module can include a third transistor having a drain coupled to the first input terminal, a gate coupled to the second input terminal via the second resistor, and a source coupled to a ground terminal of the switching module. In some embodiments, the switching module can further include a fourth transistor having a drain coupled to the second input terminal, a gate coupled to the first input terminal via the first resistor, and a source coupled to the ground terminal.

In some embodiments, the switching module can include a third capacitor disposed between the gate of the first transistor and the ground terminal of the switching module. In some embodiments, the switching module can further include a fourth capacitor disposed between the gate of the second transistor and the ground terminal.

In some embodiments, the switching module can include a fifth transistor having a drain coupled to the first input terminal, a gate coupled to the bias voltage output, and a source coupled to the ground terminal. In some embodiments, the switching module can further include a sixth transistor having a drain coupled to the second input terminal, a gate coupled to the bias voltage output, and a source coupled to the ground terminal.

In some embodiments, the switching module can include circuitry having an output coupled to the output terminal. In some embodiments, the circuitry can include a controller configured to selectively provide a bias voltage via the bias voltage output. In some embodiments, the controller can include a power converter to convert a battery voltage to the bias voltage.

In some embodiments, the circuitry can include a directional coupler having a first output coupled to the output terminal. In some embodiments, the circuitry can include a power amplifier coupled an input of the directional coupler. In some embodiments, the circuitry can include a transmit/reflect switch disposed between the first output of the directional coupler and the output terminal and disposed between a second output of the directional coupler and the output terminal.

In some embodiments, a first input signal received on the first input terminal or the second input terminal can be shorted to a ground terminal in response to a second input signal received on the other of the first input terminal or the second input terminal including a positive direct-current (DC) voltage.

In some embodiments, the switching module can include a third input terminal and the output terminal can be configured to output a radio-frequency (RF) component of an input signal received on the third input terminal in response to the input signal including a positive direct-current (DC) voltage.

In some implementations, the present disclosure relates to a transmission module. The transmission module includes a directional coupler disposed between a radio-frequency (RF) input terminal and a radio-frequency (RF) output terminal. The transmission module includes a direct-current (DC) component configured to generate a DC voltage. The transmission module further includes a coupler terminal configured to output a combination of the DC voltage and an RF output of the directional coupler.

In some embodiments, the transmission module can include a transmit/reflect switch disposed between a first RF output of the directional coupler and the coupler terminal and disposed between a second RF output of the directional coupler and the output terminal.

In some embodiments, the DC component can be implemented in a controller configured to control the transmit/reflect switch. In some embodiments, the DC component can include a power converter configured to generate the DC voltage from a received battery voltage.

In some implementations, the present disclosure relates to a wireless device including a transceiver configured to generate a first input radio-frequency (RF) signal. The wireless device includes a first front-end module (FEM) in communication with the transceiver. The first FEM includes a first packaging substrate configured to receive a plurality of components. The first FEM further including a first transmission system and a switching module implemented on the first packaging substrate. The first transmission system is configured to amplify the first RF signal. The switching module has a first input terminal, a second input terminal, and an output terminal configured to output a radio-frequency (RF) component of an input signal received on the first input terminal or the second input terminal in response to the input signal including a positive direct-current (DC) voltage. The wireless device includes a first antenna in communication with the first FEM. The first antenna is antenna configured to transmit the amplified first RF signal.

In some embodiments, the transmission system can further include a directional coupler having an output coupled to the output terminal.

In some embodiments, the wireless device can further include a second FEM module in communication with the transceiver. The second FEM can include a second packaging substrate configured to receive a plurality of components. The second FEM can further include a second transmission system configured to amplify a second RF signal received from the transceiver. The wireless device can further include a second antenna in communication with the second FEM. The second antenna can be configured to transmit the amplified second RF signal. The second FEM module can have a coupler terminal configured to output a combination of a DC voltage and an RF output of a directional coupler coupled to the second antenna. The coupler terminal (of the second FEM) can be coupled to the first input terminal (of the first FEM).

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Described herein is a technique for a single-pole multi-throw RF switch within an unpowered module to actively switch RF signals from active companion modules to a single RF output. In embodiments described herein, a control command and associated control software may be unused or eliminated. In embodiments described herein, the module containing the multiplexing switch may not be powered up or digitally controlled. Further, embodiments disclosed herein may not include discrete switch control lines between modules.

Figure 1:
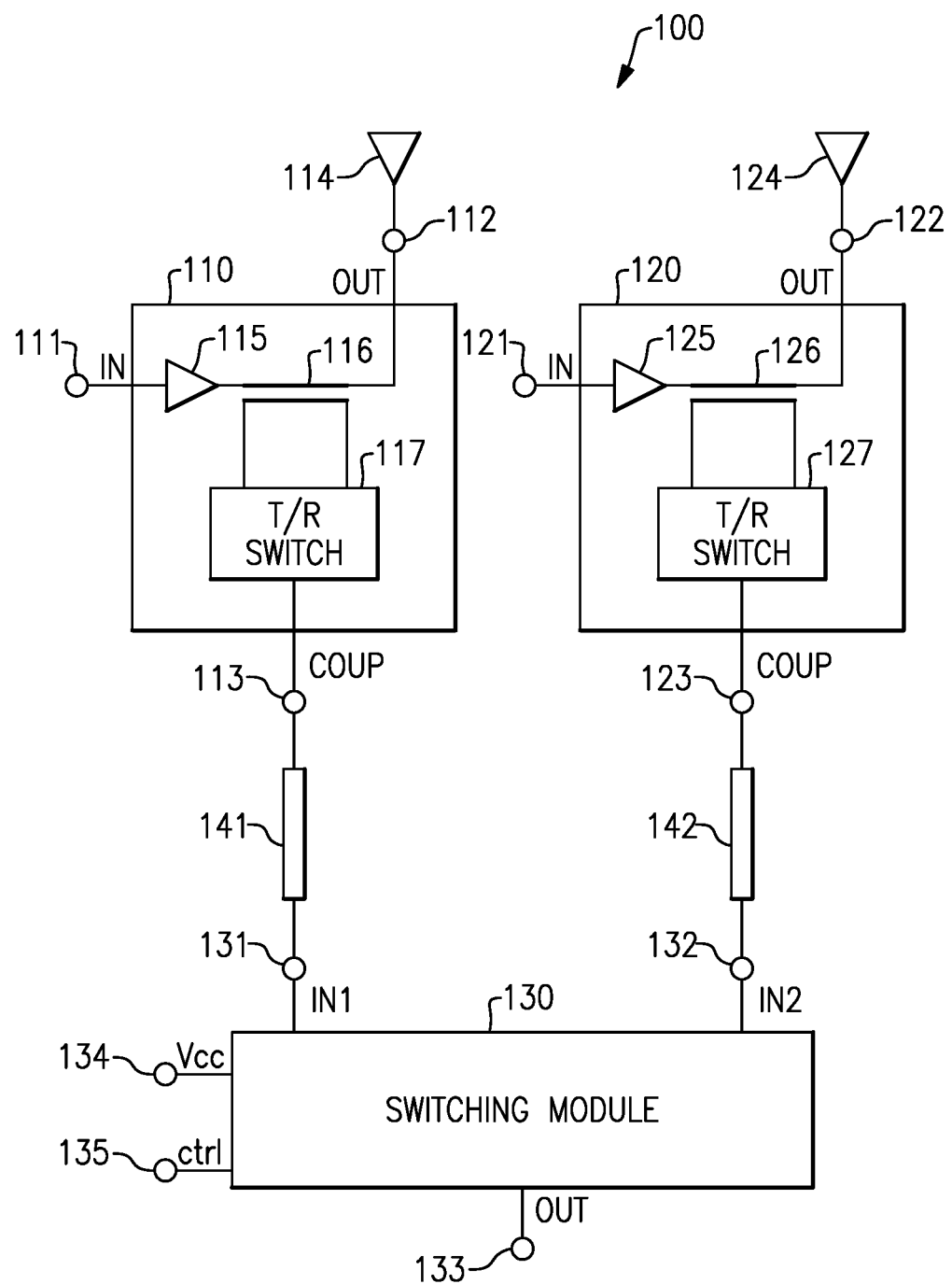
FIG. 1 shows a wireless communication configuration including multiple transmission modules.

FIG. 1 shows a wireless communication configuration 100 including multiple transmission modules 110, 120. Each of the transmission modules 110, 120 has an input terminal 111, 121 for receiving a radio-frequency (RF) input signal for transmission via an antenna 114, 124. Each of the transmission modules 110, 120 includes a power amplifier 115, 125 for amplifying the input signal. The amplified input signal (referred to as the output signal) is output via an output terminal 112, 122 and transmitted via the antenna 114, 124.

Each of the transmission modules 110, 120 also includes a directional coupler 116, 126 between the power amplifier 115, 125 and the output terminal 112, 122. The directional coupler 116, 126 provides a measurement of the signal transmitted via the antenna 114, 124 (referred to as the transmitted signal) and a measurement of the signal reflected from the antenna 114, 124 (referred to as the reflected signal). Both of these measurements are provided to a transmit/reflect (T/R) switch 117, 127 which selects one of those measurements to be output via a coupler terminal 113, 123.

The coupler terminals 113, 125 of the transmission modules 110, 120 are coupled, via respective transmission lines 141, 142, to respective input terminals 131, 132 of a switching module 130. The switching module 130 includes a first input terminal 131, a second input terminal 132, and an output terminal 133. Based on a control signal received via a control terminal 135, the switching module 130 provides, as an output signal at the output terminal 133, either the signal received at the first input terminal 131 or the second input terminal 132.

The switching module 130 further has a power terminal 134 for receiving a DC voltage to power the switching module 130. The DC voltage can be, for example, a battery voltage (e.g., from a battery) or a supply voltage (e.g., from a power supply). The DC voltage may be used, for example, to bias one or more transistors within the switching module.

Each of the transmission modules 110, 120 can also have a power terminal (not shown) for receiving power to power the transmission module.

To control the switching module 130, the switching module 130 (containing a multiplexing RF switch) is powered up, e.g., receives power via the power terminal 134, and a control signal is provided to select the desired input (e.g., via the control terminal 135). Powering the switching module 130 can undesirably reduce battery life. Further, generating and transmitting the control signal can undesirably be performed at the cost of associated control software.

Accordingly, in some embodiments, a wireless communication configuration includes a switching module that is not powered via a power terminal or controlled via a control terminal.

Figure 2:
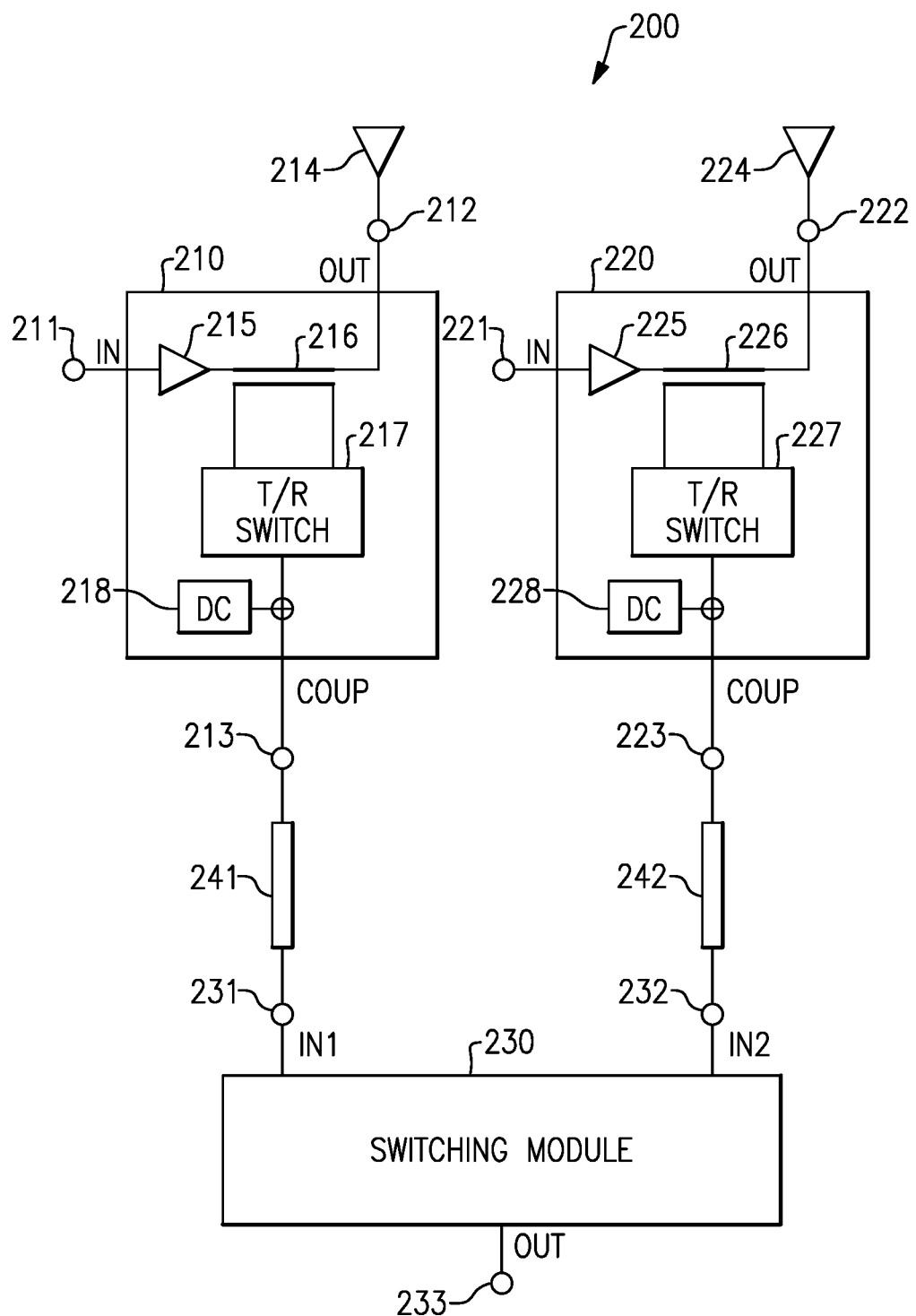
FIG. 2 shows that in some embodiments, a wireless communication configuration can include a switching module without a power terminal or a control terminal.

FIG. 2 shows that in some embodiments, a wireless communication configuration 200 can include a switching module without a power terminal or a control terminal. Like the wireless communication configuration 100 of FIG. 1, the wireless communication configuration 200 of FIG. 2 includes two transmission modules 210, 220. Although the wireless communication configuration 200 of FIG. 2 includes two transmission modules 210, 220, it is to be appreciated that other wireless communication configurations can include three or more transmission modules.

Each of the transmission modules 210, 220 has an input terminal 211, 221 for receiving a radio-frequency (RF) input signal for transmission via a respective antenna 214, 224. Each of the transmission modules 210, 220 includes a power amplifier 215, 225 for amplifying the input signal. The amplified input signal (referred to as the output signal) is output via an output terminal 212, 222 and transmitted via the antenna 214, 224.

Each of the transmission modules 210, 220 also includes a directional coupler 216, 226 between the power amplifier 215, 225 and the output terminal 212, 222. The directional coupler 216, 226 provides a measurement of the signal transmitted via the antenna 214, 224 (referred to as the transmitted signal) and a measurement of the signal reflected from the antenna 214, 224 (referred to as the reflected signal). Both of these measurements are provided to a transmit/reflect (T/R) switch 217, 227 which selects one of those measurements to be output via a coupler terminal 213, 223.

Also output via the coupler terminal 213, 223 is a positive DC voltage provided by a DC component 218, 228 (e.g., a DC voltage greater than a threshold, such as a transistor biasing threshold). Thus, the output at the coupler terminal 213, 223 is combination of a positive DC voltage and an RF output of the directional coupler 216, 226 (e.g., a RF measurement of the transmitted or reflected signal).

The coupler terminals 213, 223 of the transmission modules 210, 220 are coupled, via respective transmission lines 241, 242, to respective input terminals 231, 232 of a switching module 230. The switching module 230 includes a first input terminal 231, a second input terminal 232, and an output terminal 233. Unlike to switching module 130 of FIG. 1, the switching module 230 of FIG. 2 does not include a control terminal or a power terminal. The switching module 230 of FIG. 2 outputs the RF component of the signal received at the first input terminal 231 when the signal received at the first input terminal 231 includes a positive DC voltage and outputs the RF component of the signal received at the second input terminal 232 when the signal received at the second input terminal 232 includes a positive DC voltage.

Thus, without receiving power or a control signal (except the positive DC voltage on either the first input terminal 231 or the second input terminal 232), the switching module 230 outputs the RF component of either the signal received at the first input terminal 231 or the second input terminal 232.

Thus, the wireless communication configuration 200 can output, via the output terminal of the switching module 230, a measurement of the transmitted signal or the reflected signal of the first transmission module 210 without powering the second transmission module 220 or the switching module 230. Similarly, the wireless communication configuration 200 can output, via the output terminal of the switching module 230, a measurement of the transmitted signal or the reflected signal of the second transmission module 220 without powering the first transmission module 210 or the switching module 230.

The measurement of the transmitted signal and/or reflected signal from either of the transmission modules 210, 220 can be provided to a baseband system to, for example, control the transmission power, control the amount of radiated power, or tune an antenna tuner.

Figure 3:
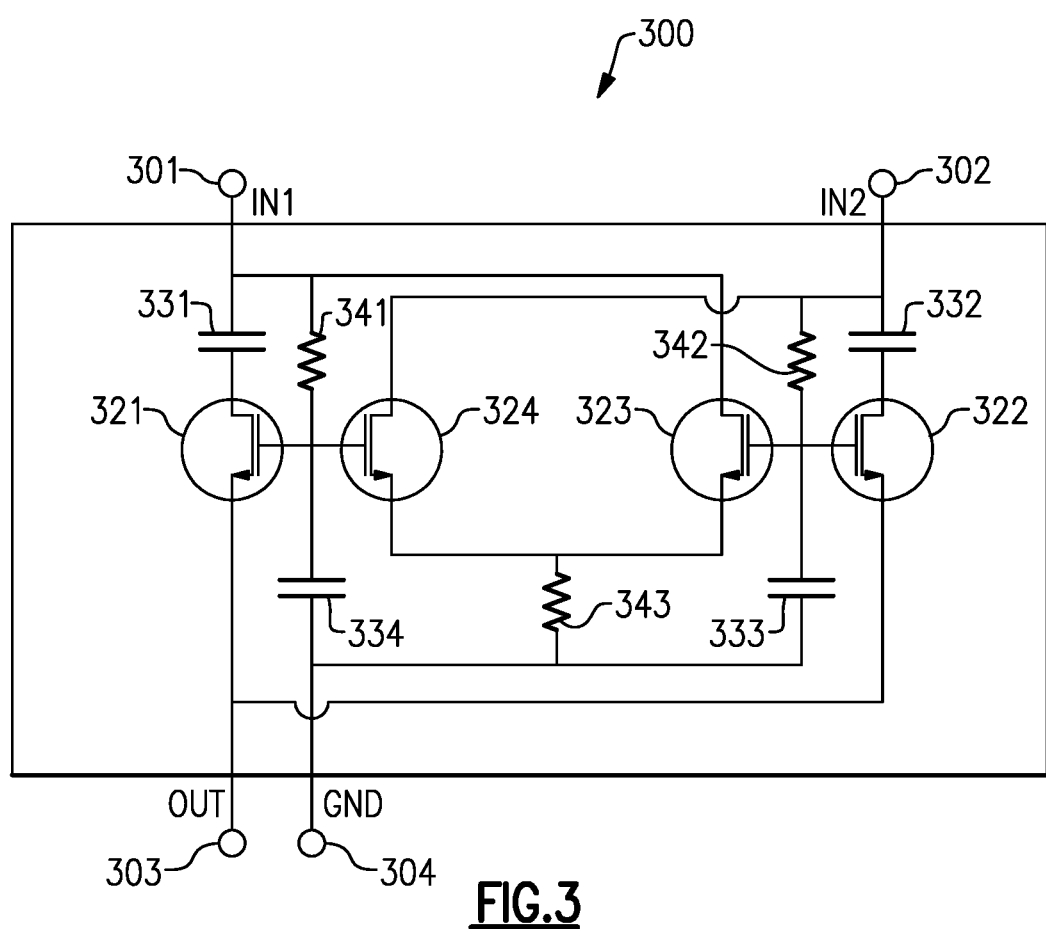
FIG. 3 shows that in some embodiments, a switching module may not have a power terminal or a control terminal.

FIG. 3 shows that in some embodiments, a switching module 300 may not have a power terminal or a control terminal. The switching module 300 of FIG. 3 may be used, for example, in the wireless communication configuration 200 of FIG. 2 to perform the switching functions described above.

The switching module 300 has a first input terminal 301, a second input terminal 302, and an output terminal 303. The switching module 300 further has a ground terminal 304 for coupling to a ground potential. The switching module 300 does not include a power terminal for receiving power to power the switching module 300. The switching module 300 does not include a control terminal for receiving a control signal to select between outputting the signal from the first input terminal 301 or the second input terminal 302. Rather, as described above, the switching module 300 outputs the RF component of the signal received on either the first input terminal 301 or the second input terminal 302 based on whether a positive DC voltage is received at the first input terminal 301 or the second input terminal 302. In particular, when the signal received at the first input terminal 301 includes a positive DC voltage, the switching module 300 outputs (at the output terminal 303) the RF component of the signal received at the first input terminal 301. Similarly, when the signal received at the second input terminal 302 includes a positive DC voltage, the switching module 300 outputs (at the output terminal 303) the RF component of the signal received at the second input terminal 302.

The switching module 300 includes a first transistor 321 coupled between the first input terminal 301 and the output terminal 303. The first transistor has a drain coupled to the first input terminal 301 via a first capacitor 331, a gate coupled to the first input terminal via a first resistor 341, and a source coupled to the output terminal 303. Although the first transistor 321 is described herein as a field-effect transistor (FET), it will be understood that the first transistor 321 (and other transistors described herein) may be implemented with other types of transistors, such as bipolar junction transistors (BJTs) (e.g., heterojunction bipolar transistors (HBTs)). Similarly, the use of particular terms, such as "gate", "drain", or "source" should not be taken to imply a particular transistor type, and should be considered interchangeable with other terms (such as "base", "collector", or "emitter") typically used to refer to other types of transistors.

The switching module 300 includes a second transistor 322 coupled between the second input terminal 302 and the output terminal 303. The second transistor has a drain coupled to the second input terminal 302 via a second capacitor 332, a gate coupled to the second input terminal 302 via a second resistor, and a source coupled to the output terminal 303.

The switching module 300 includes a third transistor 323 coupled between the first input terminal 301 and the ground terminal 304. The third transistor 323 has a drain coupled to the first input terminal 301, a source coupled to the ground terminal 304 via a termination resistor 343, and a gate coupled to the second input terminal 302 via the second resistor 342. The switching module includes a fourth transistor 324 coupled between the second input terminal 302 and the ground terminal 304. The fourth transistor 324 has a drain coupled to the second input terminal 302, a source coupled to the ground terminal 304 via the termination resistor 343, and a gate coupled to the first input terminal 301 via the first resistor 341.

The gate of the third transistor 323 and the gate of the fourth transistor 324 are each coupled to the ground terminal 304 via a respective capacitor 333, 334. In some implementations, a leak resistor (not shown) can couple the output terminal 303 and the ground terminal 304. The resistance of the leak resistor can be, for example, 5 kilohms.

When the signal received at the first input terminal 301 include a positive DC voltage, the positive DC voltage passes through the first resistor 341 to bias the first transistor 321. With the first transistor 321 biased, the RF component of the signal received at the first input terminal 301 passes through the first transistor 321 to the output terminal 303. Also, the positive DC voltage biases the fourth transistor 324 to terminate the second input terminal 302 via a grounded termination resistor 343, usually 50 ohms. Similarly, when the signal received at the second input terminal 302 includes a positive DC voltage, the positive DC voltage passes through the second resistor 342 to bias the second transistor 322 and allow the RF component to pass through to the output terminal 303. Also, the positive DC voltage biases the third transistor 323 to terminate the first input terminal 301 via the grounded termination resistor 343.

Thus, the output terminal 303 is configured to output an RF component of an input signal received on the first input terminal 301 or the second input terminal 302 in response to the input signal including a positive DC voltage. In some implementations, the switching module 300 can include additional input terminals (e.g., a third input terminal), and the output terminal 303 can be configured to output an RF component of an input signal received on one of the additional input terminals (e.g., the third input terminal) in response to the input signal including a positive DC voltage. Further, a first input signal received on the first input terminal 301 or the second input terminal 302 is terminated via the grounded termination resistor 343 in response to a second input signal received on the other of the first input terminal 301 or the second input terminal 302 including a positive DC voltage.

Thus, the switching module 300 includes a plurality of input terminals 301, 302 and an output terminal 303 configured to output a radio-frequency (RF) component of an input signal received on one of the plurality of input terminals in response to the input signal including a positive direct-current (DC) voltage.

Figure 4:
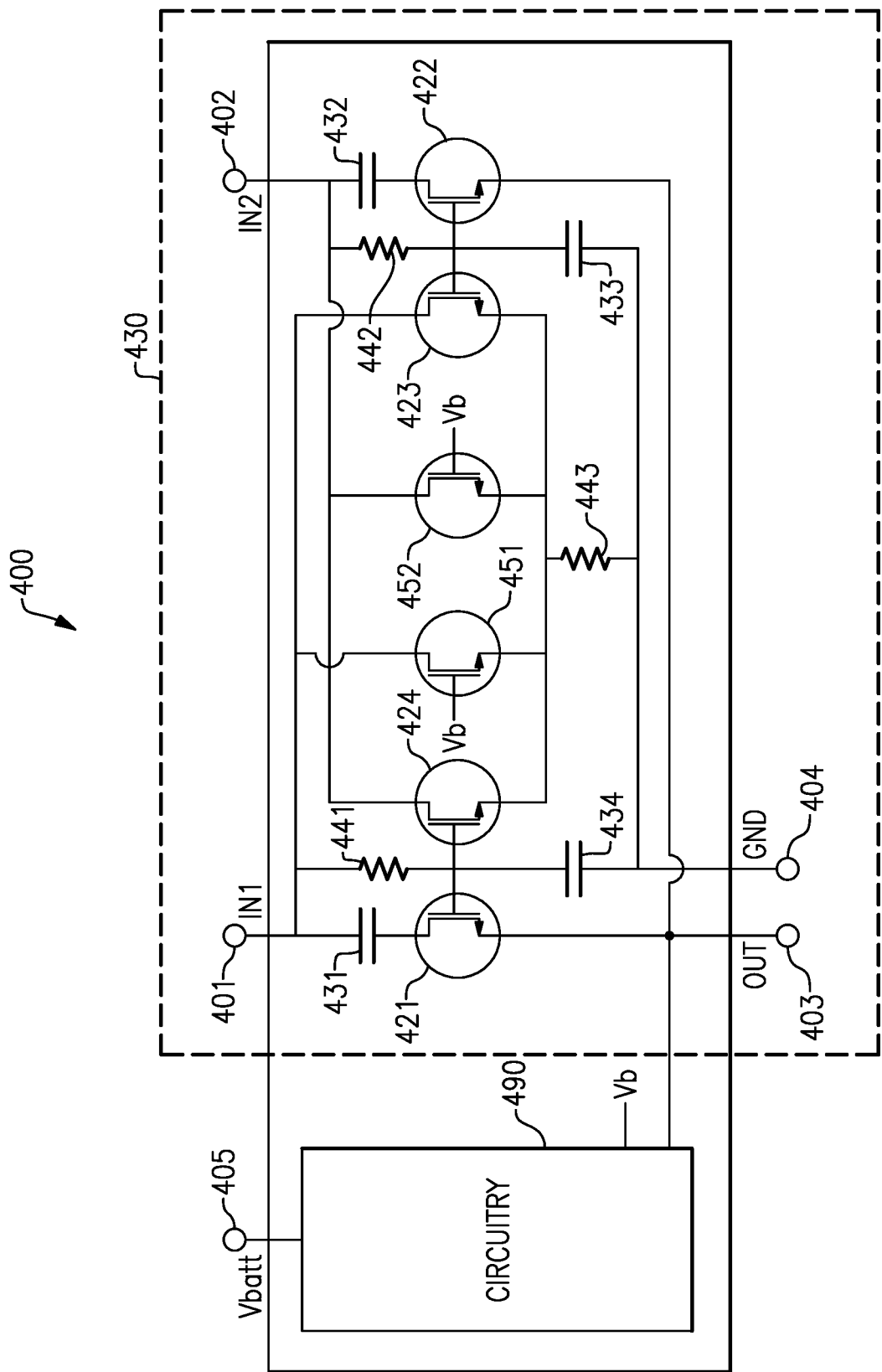
FIG. 4 shows that in some implementations, a switching module can be implemented in a powered module that includes additional functions.

FIG. 4 shows that in some implementations, a switching module 430 can be implemented in a module 400 that includes additional functions. The module 400 includes circuitry 490 and a switching module 430 that share an output terminal 403. The circuitry 490 has a power terminal 405 for receiving power (e.g., as a battery voltage or supply voltage) to power the module 400. In some embodiments, the circuitry 490 provides a bias voltage (Vb) to the switching module 430. The circuitry 490 generates an output signal that can be output from the module 400 via the output terminal 403.

Like the switching module 330 of FIG. 3, the switching module 430 includes a first transistor 421 coupled between a first input terminal 401 and the output terminal 403. The first transistor 421 has a drain coupled to the first input terminal 401 via a first capacitor 431, a gate coupled to the first input terminal via a first resistor 441, and a source coupled to the output terminal 403. The switching module 430 includes a second transistor 422 coupled between the second input terminal 402 and the output terminal 403. The second transistor 422 has a drain coupled to the second input terminal 402 via a second capacitor 432, a gate coupled to the second input terminal 402 via a second resistor, and a source coupled to the output terminal 403.

The switching module 430 includes a third transistor 423 coupled between the first input terminal 401 and the ground terminal 404. The third transistor 423 has a drain coupled to the first input terminal 401, a source coupled to the ground terminal 404 via a termination resistor 443, and a gate coupled to the second input terminal 402 via the second resistor 442. The switching module 430 includes a fourth transistor 424 coupled between the second input terminal 402 and the ground terminal 404. The fourth transistor 424 has a drain coupled to the second input terminal 402, a source coupled to the ground terminal 404 via the termination resistor 443, and a gate coupled to the first input terminal 401 via the first resistor 441.

The gate of the third transistor 423 and the gate of the fourth transistor 424 are each coupled to the ground terminal 404 via a respective capacitor 433, 434. In some implementations, a leak resistor (not shown) can couple the output terminal 403 and the ground terminal 404. The resistance of the leak resistor can be, for example, 5 kilohms.

The switching module 430 includes fifth transistor 451 coupled between the first input terminal 401 and the ground terminal 404. The fifth transistor 451 has a drain coupled to the first input terminal 401, a source coupled to the ground terminal 404 via the termination resistor 443, and a gate coupled to a bias voltage output of the circuitry 490. The switching module 430 includes a sixth transistor 452 coupled between the second input terminal 402 and the ground terminal 404. The sixth transistor 452 has a drain coupled to the second input terminal 402, a source coupled to the ground terminal 404 via the termination resistor 443, and a gate coupled to the bias voltage output of the circuitry 490.

When the module 400 is unpowered, e.g., no power is supplied to the power terminal 405, the module 400 acts as the switching module 300 of FIG. 3. Thus, when the signal received at the first input terminal 401 (or second input terminal 402) includes a positive DC voltage, the positive DC voltage passes through the first resistor 441 (or second resistor 442) to bias the first transistor 421 (or second transistor 422) and allow the RF component to pass through to the output terminal 403.

When the module 400 is powered, the circuitry 490 provides a bias voltage to the gates of the fifth transistor 451 and sixth transistor 451 and the output of the circuitry 490 is output via the output terminal 403.

Figure 5:
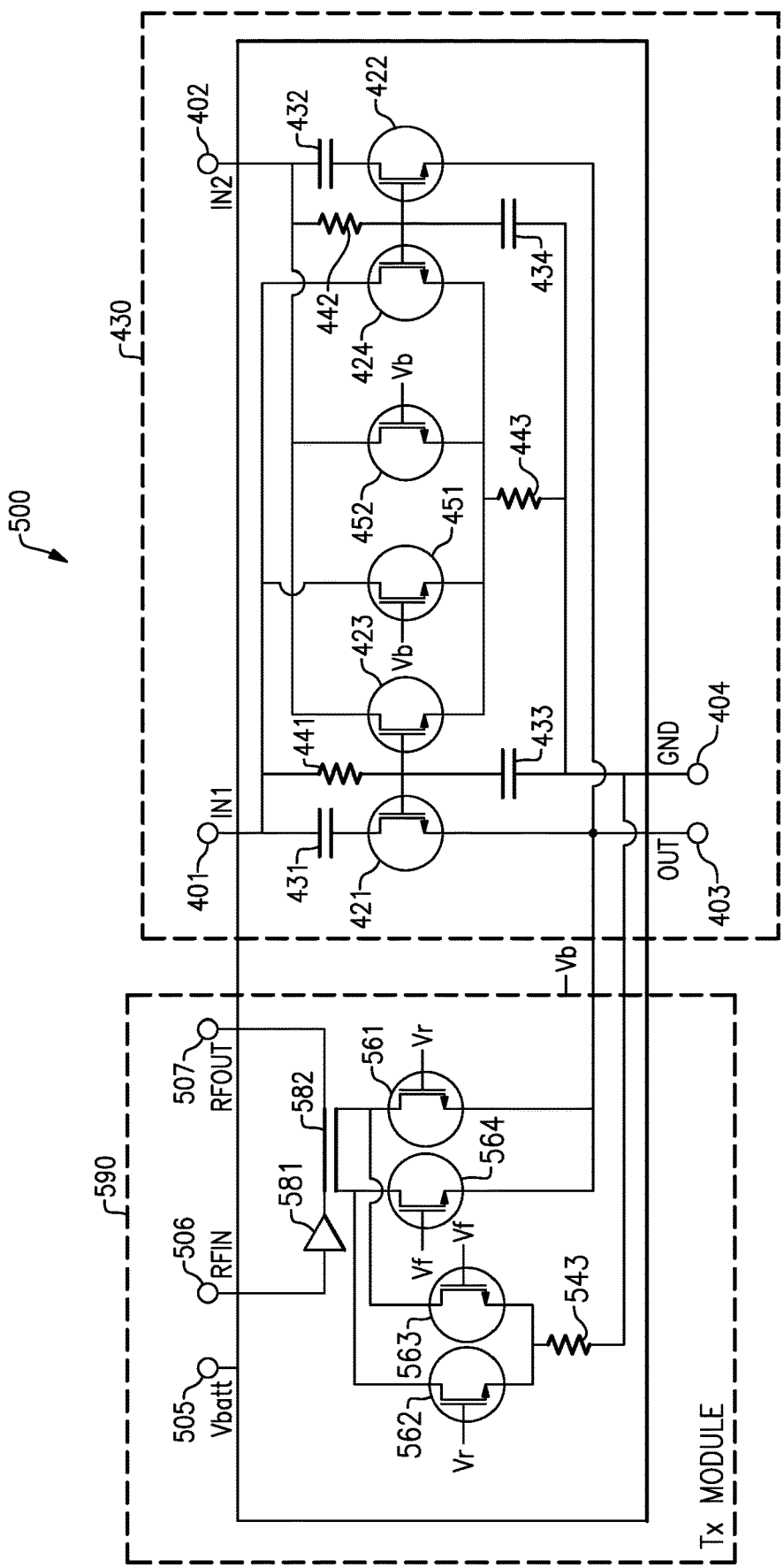
FIG. 5 shows that in some embodiments a module can include a transmission module and a switching module.

FIG. 5 shows that in some embodiments a module 500 can include a transmission module 590 and a switching module 430. The module 500 includes the switching module 430 as described above with respect to FIG. 4. The module 500 further includes circuitry in the form of a transmission module 590 (similar to the transmission module 110 as described above with respect to FIG. 1).

The transmission module 590 has an RF input terminal 506 for receiving a RF input signal for transmission via an antenna coupled to an RF output terminal 507. The transmission module 590 includes a power amplifier 581 for amplifying the RF input signal. The amplified RF input signal (referred to as the RF output signal) is output via the RF output terminal 507 to be transmitted via an antenna.

The transmission module 590 also includes a directional coupler 582 between the power amplifier 581 and the RF output terminal 507. In various implementations, the directional coupler 582 is a bi-directional (or dual-directional) coupler. Thus, the directional coupler 582 provides a measurement of the signal transmitted via an antenna (referred to as the transmitted signal) and a measurement of the signal reflected from the antenna (referred to as the reflected signal). Both of these measurements are provided to a transmit/reflect (T/R) switch which selects one of those measurements to be output via the output terminal 403 of the module 500.

The T/R switch includes a first reverse transistor 561 having a drain coupled to a first output of the directional coupler 582 and a source coupled to the output terminal 403. The T/R switch includes a second reverse transistor 562 having a drain coupled to a second output of the directional coupler 582 and a source coupled to the ground terminal 404 via a resistor 543.

The T/R switch includes a first forward transistor 563 having a drain coupled to the first output of the directional coupler 582 and a source coupled to the ground terminal 404 via the resistor 543. The T/R switch includes a second forward transistor 564 having a drain coupled to the second output of the directional coupler 582 and a source coupled to the output terminal 403.

When the first reverse transistor 561 and second reverse transistor 562 are biased on with a positive reverse voltage Vr, such as 2.5 V (and the first forward transistor 563 and second forward transistor 564 are not biased, the measurement of the reflected signal is connected through the first reverse transistor 561 to the output terminal 403 and the opposite side of the directional coupler 582 is terminated through the termination resistor 543.

Similarly, when the first forward transistor 563 and second forward transistor 564 are biased on with a positive forward voltage Vf, such as 2.5 V (and the first reverse transistor 561 and second reverse transistor 562 are not biased, the measurement of the transmitted signal is connected through the second forward transistor 564 to the output terminal 403 and the opposite side of the directional coupler 582 is terminated through the termination resistor 543.

The bias voltage (Vb), reverse voltage (Vr), and forward voltage (Vf) can be generated from a battery voltage (Vbatt) or a supply voltage (Vcc) received via the power terminal 505. To that end, the transmission module can include a power converter.

Figure 6:
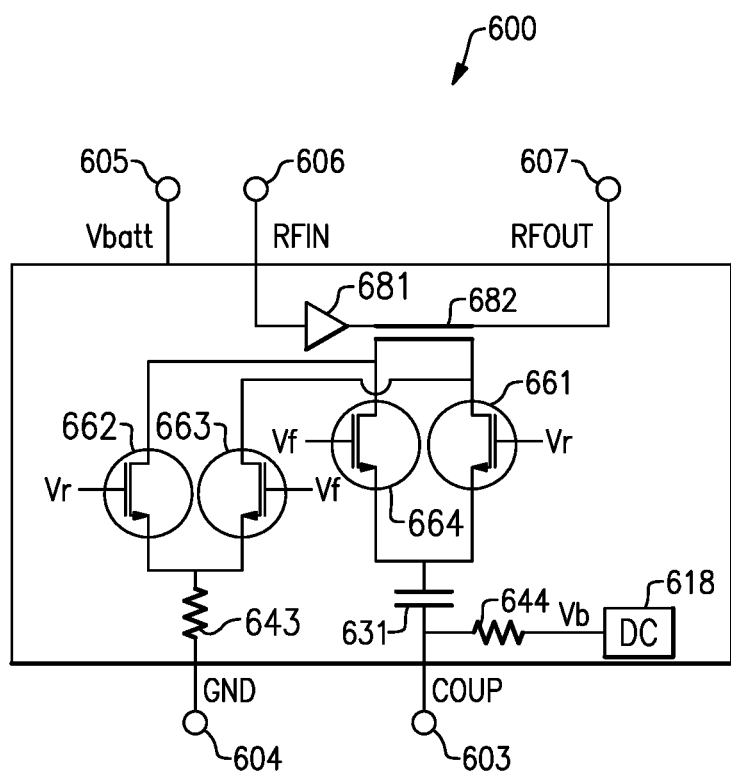
FIG. 6 shows that in some embodiments, a transmission module can output an RF coupler signal with a DC bias.

FIG. 6 shows that in some embodiments, a transmission module 600 can output an RF coupler signal with a DC bias. The transmission module 600 has an RF input terminal 606 for receiving a RF input signal for transmission via an antenna coupled to an RF output terminal 607. The transmission module 600 includes a power amplifier 681 for amplifying the RF input signal. The amplified RF input signal (referred to as the RF output signal) is output via the RF output terminal 607 to be transmitted via an antenna.

The transmission module 600 also includes a directional coupler 682 between the power amplifier 681 and the RF output terminal 607. The directional coupler 682 provides a measurement of the signal transmitted via an antenna (referred to as the transmitted signal) and a measurement of the signal reflected from the antenna (referred to as the reflected signal). Both of these measurements are provided to a T/R switch which selects one of those measurements to be output via a coupler terminal 603 of the transmission module 600.

The T/R switch includes a first reverse transistor 661 having a drain coupled to a first output of the directional coupler 682 and a source coupled to the coupler terminal 603 (via a capacitor 644). The T/R switch includes a second reverse transistor 662 having a drain coupled to a second output of the directional coupler 682 and a source coupled to a ground terminal 604 (which is to be coupled to ground potential) via a resistor 643.

The T/R switch includes a first forward transistor 663 having a drain coupled to the first output of the directional coupler 682 and a source coupled to the ground terminal 604 via the resistor 643. The T/R switch includes a second forward transistor 664 having a drain coupled to the second output of the directional coupler 682 and a source coupled to the coupler terminal 603 (via the capacitor 631).

When the first reverse transistor 661 and second reverse transistor 662 are biased on with a positive reverse voltage Vr, such as 2.5 V (and the first forward transistor 663 and second forward transistor 664 are not biased, the measurement of the reflected signal is connected through the first reverse transistor 661 to the coupler terminal 603 and the opposite side of the directional coupler 682 is terminated through the termination resistor 643.

Similarly, when the first forward transistor 663 and second forward transistor 664 are biased on with a positive forward voltage Vf, such as 2.5 V (and the first reverse transistor 661 and second reverse transistor 662 are not biased, the measurement of the transmitted signal is connected through the second forward transistor 664 to the coupler terminal 603 and the opposite side of the directional coupler 682 is terminated through the termination resistor 643.

The transmission module 600 includes a DC bias generator 618 that generates a DC bias voltage (Vb) that is provided to the coupler terminal 603 via a resistor 644. The capacitor 631 and the resistor 644 form an RC combiner that combines the RF coupler measurement signal with the DC bias voltage for output via the coupler terminal 603.

The bias voltage (Vb), reverse voltage (Vr), and forward voltage (Vf) can be generated from a battery voltage (Vbatt) or a supply voltage (Vcc) received via the power terminal 605. To that end, the transmission module can include a power converter.

Figure 7:
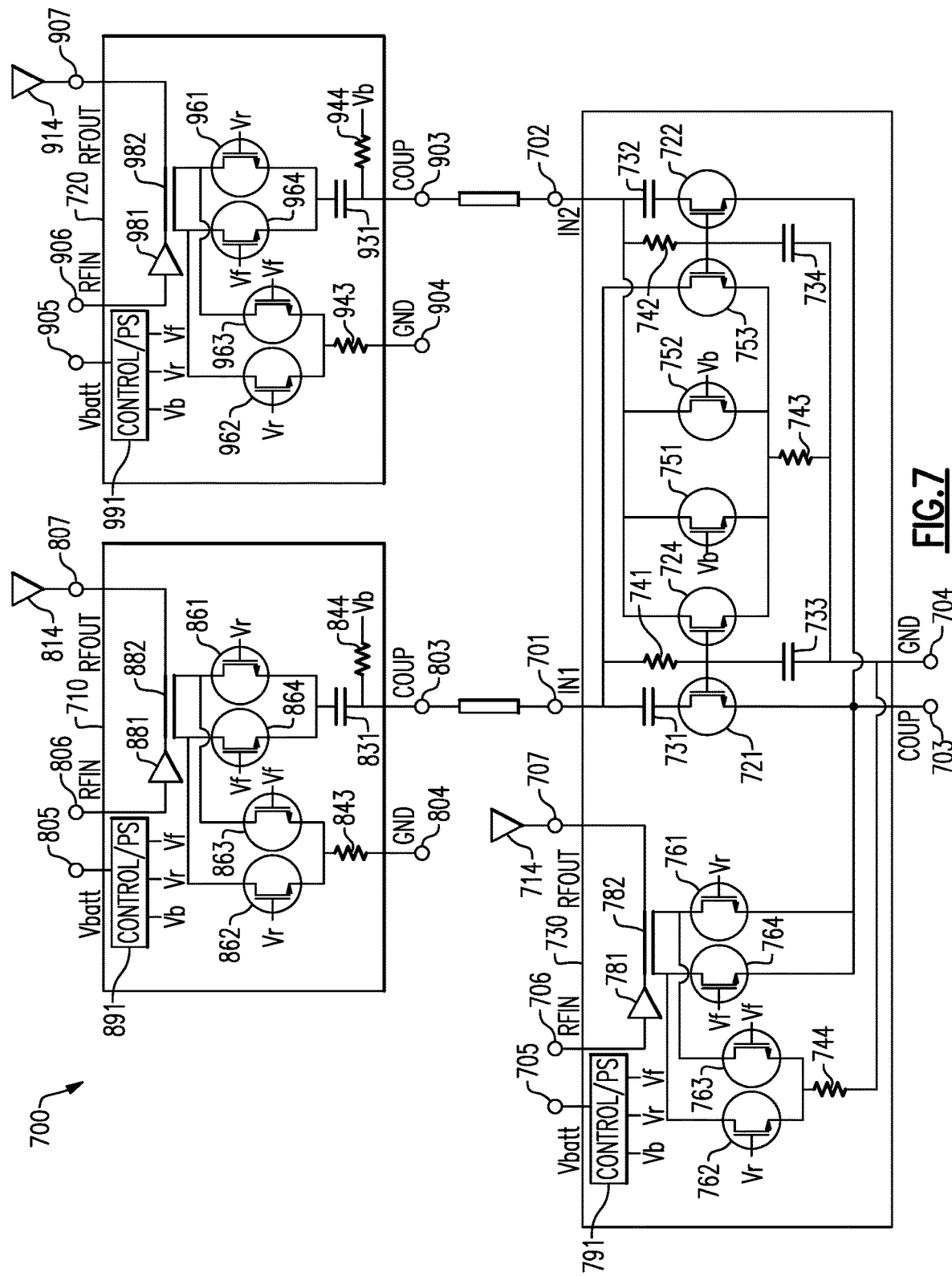
FIG. 7 shows that in some embodiments, a wireless communications configuration can include a base module and multiple companion modules.

FIG. 7 shows that in some embodiments, a wireless communications configuration 700 can include a base module 730 and multiple companion modules 710, 720. The wireless communications configuration 700 is shown to be a specific example of the wireless communication configuration 200 of FIG. 2 in which the base module 730 is substantially similar to the module 500 of FIG. 5 and each of the companion modules 710, 720 is substantially similar to the transmission module 600 of FIG. 6.

Thus, the base module 730 includes a first transistor 721 coupled between a first input terminal 701 and a coupler terminal 703. The first transistor 721 has a drain coupled to the first input terminal 701 via a first capacitor 731, a gate coupled to the first input terminal 701 via a first resistor 741, and a source coupled to the coupler terminal 703. The base module 730 includes a second transistor 722 coupled between the second input terminal 702 and the coupler terminal 703. The second transistor 722 has a drain coupled to the second input terminal 702 via a second capacitor 732, a gate coupled to the second input terminal 702 via a second resistor 742, and a source coupled to the coupler terminal 703.

The switching module 730 includes a third transistor 723 coupled between the first input terminal 701 and a ground terminal 704. The third transistor 723 has a drain coupled to the first input terminal 701, a source coupled to the ground terminal 704 via a termination resistor 743, and a gate coupled to the second input terminal 702 via the second resistor 742. The switching module 730 includes a fourth transistor 724 coupled between the second input terminal 702 and the ground terminal 704. The fourth transistor 724 has a drain coupled to the second input terminal 702, a source coupled to the ground terminal 704 via the termination resistor 743, and a gate coupled to the first input terminal 701 via the first resistor 741.

The gate of the third transistor 723 and the gate of the fourth transistor 724 are each coupled to the ground terminal 704 via a respective capacitor 733, 734. In some implementations, a leak resistor (not shown) can couple the coupler terminal 703 and the ground terminal 704. The resistance of the leak resistor can be, for example, 5 kilohms.

The base module 730 includes fifth transistor 751 coupled between the first input terminal 701 and the ground terminal 704. The fifth transistor 751 has a drain coupled to the first input terminal 701, a source coupled to the ground terminal 704 via the termination resistor 743, and a gate coupled to a bias voltage output of a controller 791 that selectively provides a bias voltage via the bias voltage output. The base module 730 includes a sixth transistor 752 coupled between the second input terminal 702 and the ground terminal 704. The sixth transistor 752 has a drain coupled to the second input terminal 702, a source coupled to the ground terminal 704 via the termination resistor 743, and a gate coupled to the bias voltage output of the controller 791.

The base module 730 has an RF input terminal 706 for receiving a RF input signal for transmission via an antenna 714 coupled to an RF output terminal 707. The base module 730 includes a power amplifier 781 for amplifying the RF input signal. The amplified RF input signal (referred to as the RF output signal) is output via the RF output terminal 707 to be transmitted via the antenna 714.

The base module 730 includes a directional coupler 782 between the power amplifier 781 and the RF output terminal 707. The directional coupler 782 provides a measurement of the signal transmitted via the antenna 714 (referred to as the transmitted signal) and a measurement of the signal reflected from the antenna 714 (referred to as the reflected signal). Both of these measurements are provided to a T/R switch which is controlled by the controller 791 to output one of these measurements via the coupler terminal 703 of the base module 730.

The T/R switch includes a first reverse transistor 761 having a drain coupled to a first output of the directional coupler 782 and a source coupled to the coupler terminal 703. The T/R switch includes a second reverse transistor 762 having a drain coupled to a second output of the directional coupler 782 and a source coupled to the ground terminal 704 via a resistor 744.

The T/R switch includes a first forward transistor 763 having a drain coupled to the first output of the directional coupler 782 and a source coupled to the ground terminal 704 via the resistor 744. The T/R switch includes a second forward transistor 764 having a drain coupled to the second output of the directional coupler 782 and a source coupled to the coupler terminal 703.

When the base module 730 is powered (e.g., by voltage supplied to the power terminal 704) and the first reverse transistor 761, the second reverse transistor 762, the fifth transistor 751, and the sixth transistor 752 are biased (e.g., by the controller 791), the measurement of the reflected signal is output via the coupler terminal 703. When the base module 730 is powered and the first forward transistor 763, the second forward transistor 764, the fifth transistor 751, and the sixth transistor 752 are biased, the measurement of the transmitted signal is output via the output terminal.

The fifth transistor 751 and the sixth transistor 752 can be biased by a bias voltage (Vb) generated by the controller 791. The first reverse transistor 761 and the second reverse transistor 762 can be biased by a reverse voltage (Vr) generated by the controller 791. The first forward transistor 763 and the second forward transistor 764 can be biased by a forward voltage (Vf) generated by the controller 791. The bias voltage (Vb), reverse voltage (Vr), and forward voltage (Vf) can be generated from a battery voltage (Vbatt) or a supply voltage (Vcc) received via the power terminal 705. To that end, the controller 791 can include a power converter to convert a battery voltage to the bias voltage, reverse voltage, and/or forward voltage.

When the base module 730 is unpowered, e.g., no power is supplied to the power terminal 705, and a signal received at the first input terminal 701 (or second input terminal 702) includes a positive DC voltage, the positive DC voltage passes through the first resistor 741 (or second resistor 742) to bias the first transistor 721 (or second transistor 722) and allow the RF component to pass through to the coupler terminal 703. The signal received at the first input terminal 701 (or the second input terminal 702) can include the transmitted signal or reflected signal of the companion modules 710, 720 as described below.

Each of the companion modules 710, 720 has an RF input terminal 806, 906 for receiving a RF input signal for transmission via an antenna 814, 914 coupled to an RF output terminal 807, 907. Each of the companion module 710, 720 includes a power amplifier 881, 981 for amplifying the RF input signal. The amplified RF input signal (referred to as the RF output signal) is output via the RF output terminal 807, 907 to be transmitted via the antenna 814, 914.

Each of the companion modules 710, 720 also includes a directional coupler 882, 982 between the power amplifier 881, 981 and the RF output terminal 807, 901. The directional coupler 882, 982 provides a measurement of the signal transmitted via the antenna 814, 914 (referred to as the transmitted signal) and a measurement of the signal reflected from the antenna 814, 914 (referred to as the reflected signal). Both of these measurements are provided to a T/R switch which is controlled by a controller 891, 991 to output one of these measurements via a coupler terminal 803, 903 of the companion module 710, 720.

The T/R switch includes a first reverse transistor 861, 961 having a drain coupled to a first output of the directional coupler 882, 982 and a source coupled to the coupler terminal 803, 903 (via a capacitor 844, 944). The T/R switch includes a second reverse transistor 862, 962 having a drain coupled to a second output of the directional coupler 882, 982 and a source coupled to a ground terminal 804, 904 (which is to be coupled to ground potential) via a resistor 843, 943.

The T/R switch includes a first forward transistor 863, 963 having a drain coupled to the first output of the directional coupler 882, 982 and a source coupled to the ground terminal 804, 904 via the resistor 843, 943. The T/R switch includes a second forward transistor 864, 964 having a drain coupled to the second output of the directional coupler 882, 982 and a source coupled to the coupler terminal 803, 903 (via the capacitor 831, 931).

Each of the companion modules 710, 720 includes a resistor 944 that couples a bias voltage output of the controller 891, 991 and the coupler terminal 803, 903. The capacitor 831, 931 and the resistor 844, 944 form an RC combiner that combines the RF coupler measurement signal with the DC bias voltage for output via the coupler terminal 803, 903.

When one of the companion modules 710, 720 is powered (e.g., by voltage supplied to a power terminal 805, 905) and the first reverse transistor 861, 961 and the second reverse transistor 862, 962 are biased (e.g., by the controller 891, 991), the measurement of the reflected signal is output (with a DC bias voltage) via the coupler terminal 803, 903. When one of the companion module 710, 720 is powered and the first forward transistor 863, 963 and the second forward transistor 864, 964 are biased, the measurement of the transmitted signal (with a DC bias voltage) is output via the coupler terminal 803, 903.

The first reverse transistor 761 and the second reverse transistor 762 can be biased by a reverse voltage (Vr) generated by the controller 791. The first forward transistor 763 and the second forward transistor 764 can be biased by a forward voltage (Vf) generated by the controller 791. The bias voltage (Vb), reverse voltage (Vr), and forward voltage (Vf) can be generated from a battery voltage (Vbatt) or a supply voltage (Vcc) received via the power terminal 805, 905. To that end, the controller 891, 991 can include a power converter.

The coupler terminal 803 of the first companion module 710 is coupled via a transmission line to the first input terminal 701 of the base module. The coupler terminal 903 of the second companion module 720 is coupled via a transmission line to the second input terminal 702 of the base module 710. The coupler terminal 703 of the base module can be coupled to a baseband system for processing as described above (e.g., power management and antenna tuning).

Thus, the wireless communications configuration 700 allows for measurements of the transmitted signal and reflected signal of the first companion module 710 to be output from the coupler terminal 703 of the base module 710 by powering the first companion module 710 and without powering the second companion module 720, the base module 710, or a separate switching module. Similarly, the wireless communications configuration 700 allows for measurements of the transmitted signal and reflected signal of the second companion module 720 to be output from the coupler terminal 703 of the base module 710 by powering the second companion module 720 and without powering the first companion module 720, the base module 710, or a separate switching module. Measurements of the transmitted signal and reflected signal of the base module 710 can be output from the coupler terminal 703 of the base module 710 without powering the companion modules 710, 720 or a separate switching module.

Figure 8:
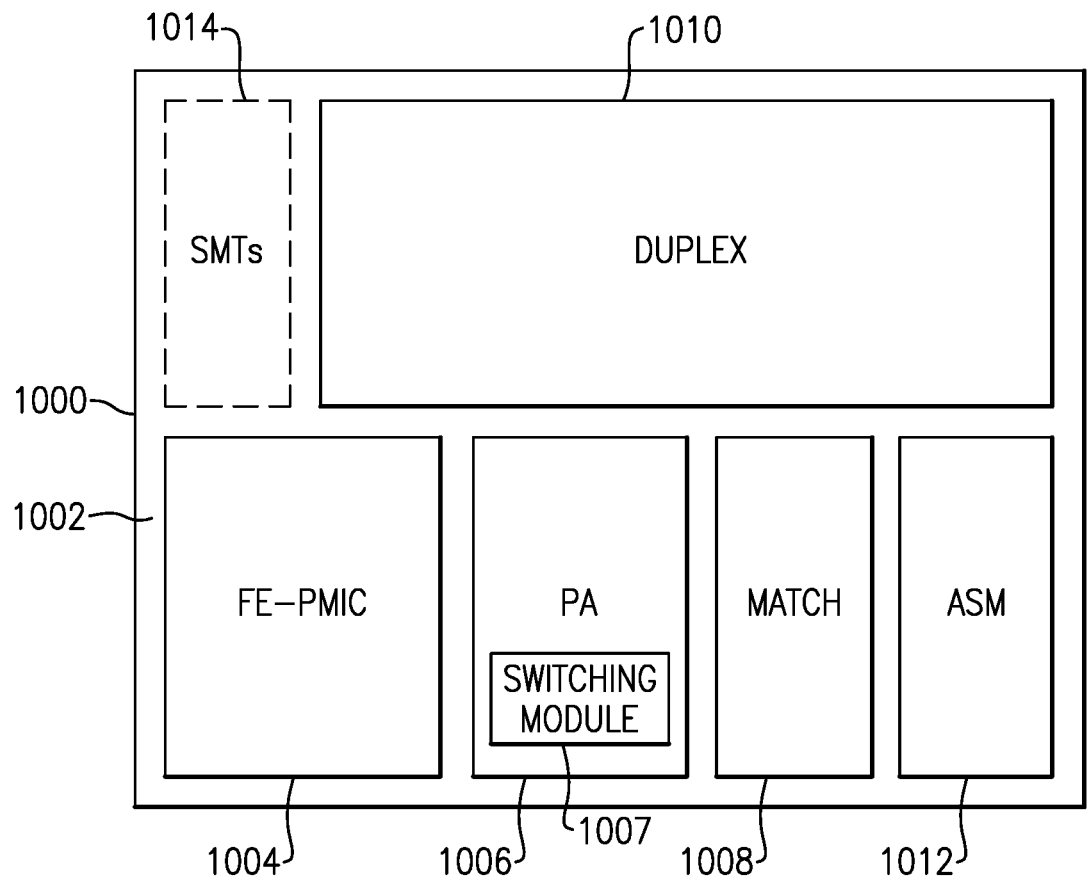
FIG. 8 depicts a module having one or more features as described herein.

FIG. 8 shows that in some embodiments, some or all of wireless communications systems (e.g., those shown in FIGS. 1-7) can be implemented, wholly or partially, in a module. Such a module can be, for example, a front-end module (FEM). In the example of FIG. 8, a module 1000 can include a packaging substrate 1002, and a number of components can be mounted on such a packaging substrate. For example, an FE-PM IC component 1004, a power amplifier assembly 1006, a match component 1008, and a duplexer assembly 1010 can be mounted and/or implemented on and/or within the packaging substrate 1002. The power amplifier assembly 1006 may include a switching module 1007 such as those described above with respect to FIGS. 1-7. Other components such as a number of SMT devices 1014 and an antenna switch module (ASM) 1012 can also be mounted on the packaging substrate 1002. Although all of the various components are depicted as being laid out on the packaging substrate 1002, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 9:
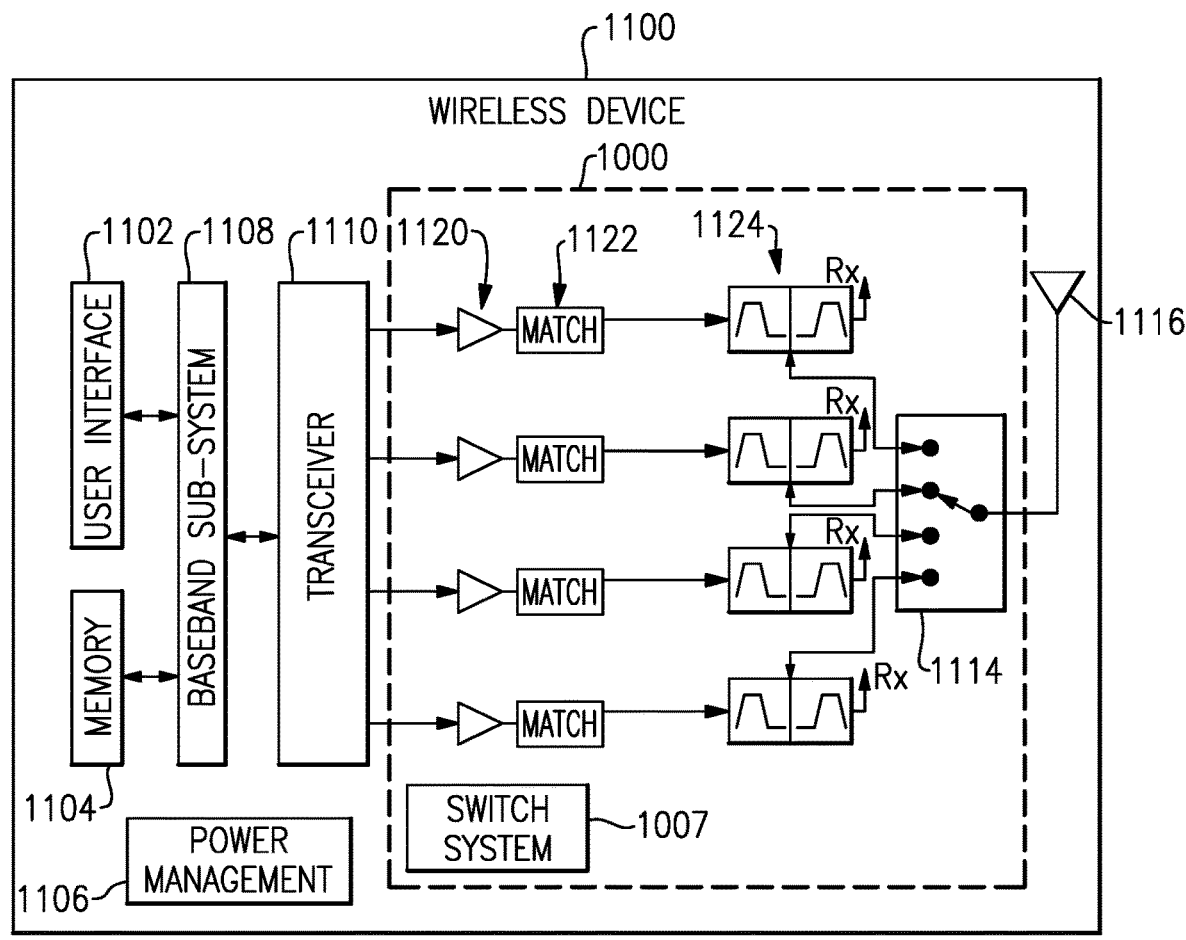
FIG. 9 depicts a wireless device having one or more features described herein.

FIG. 9 depicts an example wireless device 1100 having one or more advantageous features described herein. In the context of a module having one or more features as described herein, such a module can be generally depicted by a dashed box 1000, and can be implemented as, for example, a front-end module (FEM).

Referring to FIG. 9, power amplifiers (PAs) 1120 can receive their respective RF signals from a transceiver 1110 that can be configured and operated in known manners to generate RF signals to be amplified and transmitted, and to process received signals. The transceiver 1110 is shown to interact with a baseband sub-system 1108 that is configured to provide conversion between data and/or voice signals suitable for a user and RF signals suitable for the transceiver 1110. The transceiver 1110 can also be in communication with a power management component 1106 that is configured to manage power for the operation of the wireless device 1100. Such power management can also control operations of the baseband sub-system 1108 and the module 1000.

The baseband sub-system 1108 is shown to be connected to a user interface 1102 to facilitate various input and output of voice and/or data provided to and received from the user. The baseband sub-system 1108 can also be connected to a memory 1104 that is configured to store data and/or instructions to facilitate the operation of the wireless device, and/or to provide storage of information for the user.

In the example wireless device 1100, outputs of the PAs 1120 are shown to be matched (via respective match circuits 1122) and routed to their respective duplexers 1124. Such amplified and filtered signals can be routed to an antenna 1116 through an antenna switch 1114 for transmission. In some embodiments, the duplexers 1124 can allow transmit and receive operations to be performed simultaneously using a common antenna (e.g., 1116). In FIG. 9, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

As described herein, one or more features of the present disclosure can provide a number of advantages when implemented in systems such as those involving the wireless device of FIG. 9. For example, the disclosed embodiments may accomplish switch control with minimal input/output (I/O) between modules. As another example, RF and DC control may be carried on the same conductor. As another example, no additional software commands or discrete I/O are required to control the multiplexing switch.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switching module comprising:
   a first input terminal;
   a second input terminal;
   an output terminal configured to output a radio-frequency (RF) component of an input signal received on the first input terminal or the second input terminal in response to the input signal including a positive direct-current (DC) voltage;
   a first transistor having a drain directly coupled to the first input terminal via a first capacitor, a gate coupled to the first input terminal via a first resistor, and a source coupled to the output terminal;
   a second transistor having a drain directly coupled to the second input terminal via a second capacitor, a gate coupled to the second input terminal via a second resistor, and a source coupled to the output terminal;
   a third transistor having a drain coupled to the first input terminal, a gate coupled to the second input terminal via the second resistor, and a source coupled to a ground terminal of the switching module; and
   a fourth transistor having a drain coupled to the second input terminal, a gate coupled to the first input terminal via the first resistor, and a source coupled to the ground terminal.

2. The switching module of claim 1 further comprising:
   a third capacitor disposed between the gate of the first transistor and the ground terminal of the switching module; and
   a fourth capacitor disposed between the gate of the second transistor and the ground terminal.

3. The switching module of claim 1 further comprising:
   a fifth transistor having a drain coupled to the first input terminal, a gate coupled to a bias voltage output, and a source coupled to the ground terminal; and
   a sixth transistor having a drain coupled to the second input terminal, a gate coupled to the bias voltage output, and a source coupled to the ground terminal.

4. The switching module of claim 3 further comprising circuitry having an output coupled to the output terminal.

5. The switching module of claim 4 wherein the circuitry includes a controller configured to selectively provide a bias voltage via the bias voltage output.

6. The switching module of claim 5 wherein the controller includes a power converter to convert a battery voltage to the bias voltage.

7. The switching module of claim 4 wherein the circuitry includes a directional coupler having a first output coupled to the output terminal.

8. The switching module of claim 7 wherein the circuitry includes a power amplifier coupled to an input of the directional coupler.

9. The switching module of claim 7 wherein the circuitry includes a transmit/reflect switch disposed between the first output of the directional coupler and the output terminal and disposed between a second output of the directional coupler and the output terminal.

10. The switching module of claim 1 wherein a first input signal received on the first input terminal or the second input terminal is terminated via a grounded termination resistor in response to a second input signal received on the other of the first input terminal or the second input terminal including a positive direct-current (DC) voltage.

11. The switching module of claim 1 further comprising a third input terminal, the output terminal being configured to output a radio-frequency (RF) component of an input signal received on the third input terminal in response to the input signal including a positive direct-current (DC) voltage.

* * * * *